United States Patent Office 3,700,481
Patented Oct. 24, 1972

3,700,481

ELECTROLESSLY PLATABLE POLYMERIC BLENDS

James Chin and Harry S. Witt, Naugatuck, and Eli Schwartz, New Haven, Conn., assignors to Uniroyal, Inc., New York, N.Y.

No Drawing. Filed Aug. 23, 1968, Ser. No. 754,948
Int. Cl. B44d *1/092;* C23c *3/02*
U.S. Cl. 117—47 A 7 Claims

ABSTRACT OF THE DISCLOSURE

The present invention relates to the incorporation of an electroless metal depositing aid, which consists of various basic nitrogen-containing polymers wherein the nitrogen has an available electron pair, into a polymeric matrix capable of being formed into a plastic article with the result that the nitrogen-containing polymer renders the surface of such article suitable for electroless plating.

The present invention relates to the incorporation of an electroless metal depositing aid, which consists of various basic nitrogen-containing polymers wherein the nitrogen has an available electron pair, into a polymeric matrix capable of being formed into a plastic article with the result that the nitrogen-containing polymer renders the surface of such article suitable for electroless plating. The incorporation of the electroless metal depositing aid into the polymeric matrix which is formed into a plastic improves the ease of depositing and strength of bonding of electrolessly deposited metals to the surface thereof.

For the purpose of discussion in the present invention, a distinction is made between the terms "polymeric matrix" and "plastic" which are sometimes used in industry in overlapping senses. In the present invention, "polymeric matrix" refers to the more or less chemically homogeneous polymers or polymer blends used as starting materials in the production of molded articles, while "plastic" signifies the final solid product, which may contain fillers, plasticizers, stabilizers, pigments, etc.

The present invention relates to only a portion of the overall process which is used to deposit metals on plastics by specialized electroplating procedures. Since the electroplating process requires an electrically conductive surface upon which the plated metal is deposited, and since plastics are non-conductors, it is first necessary to render the plastic surface conductive. This is done by a series of preliminary or preplating steps, culminating in an electroless plating process step as outlined herein, which provides an improved conductive surface for the final electroplating steps. The preplating steps may include first, a conditioning step, wherein the surface of the plastic to be plated is etched in an acid bath to promote the formation of a bond between the plastic and the subsequent electroless plate. The conditioned surface is then made catalytic by a second step known as "activating." "Activating" consists of rendering the surface of the plastic catalytic by adsorption of a catalyst thereon, so that a firmly adherent metallic layer can be deposited in the electroless plating step. It has been determined that the best catalysts for this purpose are such precious metals as gold, silver and palladium.

In addition, a sensitizing step may be utilized either before or after the activating step if desired. This sensitizing (also known as accelerating) step consists of immersing the plastic into a solution of tin, titanium or some other reducing agent, and results in the formation of free metal on the surface of said plastic.

In the electroless plating step, the plastic surface which contains a precious metal or metal salt, for example palladium or palladium chloride, is immersed into an electroless copper or nickel plating bath. In the electroless bath an auto-catalytic chemical reduction occurs. The catalytic action of the precious metal such as palladium or palladium chloride reduces the plating metal, i.e., copper or nickel out of the solution so that it is deposited onto the surface of the plastic. The precious metal nuclei absorbed on the surface of the plastic are covered and the electroless plating continues until the desired thickness is achieved, i.e., somewhere between about ten (10) and forty (40) millionths of an inch. The electroless plating step results in a plastic surface that can then be electroplated by standard procedures of the electroplating industry.

The main limitation imposed on the preplating or electrolessplating operations using a plastic substrate is that the temperatures used in each cycle of the plating procedure should be no higher than the melt or flow temperatures of the plastic.

Successful electroplating of plastics depends to a large extent upon the preplating steps. It is commercially desirable to be able to electroplate a pretreated plastic article and it is equally desirable to obtain as strong a bond as possible between the plastic surface and the electroless metal deposited thereon. It is also desirable to improve the ease of processing the plastic through any or all of preplating steps listed above.

The present invention provides a means of obtaining excellent bond strength between the electroless deposited metal and plastic substrate; higher adhesion of electrolessly deposited metal to the plastic under adverse processing conditions; and good electroless plateability of the electroless metal to the plastic substrate. The incorporation of the depositing aid results in better electroless metal coverage of the plastic under a wider range of processing conditions, i.e., less critical time, temperature, concentrations of solutions limitations, faster cycles in the preplating steps, etc.

The aforesaid advantages are achieved by incorporating an electroless metal depositing aid consisting of polymeric materials (i.e., polymers having a degree of polymerization greater than about 20) which are prepared using at least one monomer which contains one or more basic nitrogen atoms, (i.e., a nitrogen atom which possesses at least one lone or unshared pair of electrons) into a linear, thermoplastic, synthetic, organic, hydrophobic polymeric matrix which can be formed into a plastic article suitable for electroplating. The electroless metal depositing aid is incorporated into the polymeric matrix to form a physical admixture by blending such depositing aid and matrix polymers, which may exist in solid or latex form, by internal mixing, milling, or any convenient method.

The matrix polymers suitable for use in the present invention are thermoplastic polymers which are generally rigid, hard and tough but not brittle and possess good impact strength, heat resistance, low temperature properties and chemical resistance.

Some thermoplastic polymers which may be used as matrix polymers in accordance with this invention are acrylonitrile-butadiene-styrene (ABS) interpolymers; copolymers of acrylonitrile and butadiene; an ABS graft polymer with unstripped butadiene monomer prepared as described in Japanese patent publication No. SHO42–15771) wherein the butadiene is 60% to 90% converted and the graft polymer has a butadiene content of between about 15% and 85% based on total weight of polymer, and correspondingly between about 85% and 15% acrylonitrile-styrene which are present in the ratios of between about 20% to 36% acrylonitrile and 80% to 64% styrene based upon the total weight acrylonitrile-styrene present; styrene-acrylonitrile copolymer blended with ABS; acetal polymers such as polyformaldehyde or polyoxyethylenes; the polymers of acrylic or methacrylic esters known as acrylics; polystyrenes and other vinyl type polymers; polyesters; polymers derived from the direct reaction between aromatic (e.g., bisphenol A) dihydroxy compounds with phosgene known as polycarbonates; polysulfones; polyolefins; and polyamides (nylon).

For the purposes of discussion in the present invention, in instances where the ABS matrix is a polyblend, i.e., a blend of styrene-acrylonitrile and butadiene-acrylonitrile rubber, etc., the blend shall be considered as a single polymer to which the electroless metal depositing aid is added.

In instances where the matrix polymer contains nitrogen atoms (e.g., ABS, polyamides, etc.) it has been determined that the nitrogen content of said matrix polymer should not be greater than 7.6% nitrogen (based upon the total weight of the matrix polymer composition) in order to retain its classification as a matrix polymer.

The matrix polymers may be prepared by free radical polymerization processes such as the standard bead, solution or mass polymerization methods. Latices of one or more interpolymers used as the matrix polymers in the present invention may conveniently be prepared by a standard emulsion polymerization process. The latices prepared as matrix polymers for use in this invention may be converted to a solid powder polymer by the conventional process of latex blending and flocculation, filtering and drying and may be blended by stirring together the resin and graft with such commercial antioxidants for the rubber such as trisnonylphenyl phosphite as described in U.S. Pat. 2,733,226 or a mixture of bisphenol sufficient to give 1% of the rubber weight. In order to flocculate the latices, the mixed latices used as matrices are added to a stirred 1% to 5% or greater solution of $CaCl_2$ or acetic acid in water. The resulting slurry of flocculated matrix polymer is cooled to room temperature and filtered. The filtered matrix polymer is then dried until the moisture content is below about 1%. This polymer is mixed by standard techniques noted previously with the nitrogen containing electroless metal depositing aid polymer. Pigments, lubricants and additives may be incorporated into the blend as desired.

Examples of some of the basic nitrogen-containing additives which are blended with said matrix polymers are poly(vinylpyridine); interpolymers of ABS and vinylpyridine which are described in copending United States application Ser. No. 754,949 filed Aug. 23, 1968, now Pat. No. 3,649,713; interpolymers of styrene, acrylonitrile and vinylpyridine; methacrylonitrile; interpolymers of methacrylonitrile, styrene and acrylonitrile; maleic anhydride imide interpolymers. It has been determined that when between about 0.1% to 45%, and preferably between 0.5% and 11% by weight of such basic nitrogen containing polymers (based upon the total weight of the blend) is incorporated into any of the matrix polymers mentioned above, the formation and coverage of the electroless metal deposit on the entire surface of the plastic is achieved. In addition, there is generally a greater bond strength between the electroless metal and the plastic, and the plastic is rendered electroplatable under less critical preplating conditions.

The preferred nitrogen containing polymer used in the present invention is poly(vinylpyridine) which includes homopolymers of vinylpyridine and copolymers with different vinylpyridine monomers made using suspension, bead, bulk or solution methods using an initiator such as azobisisobutyronitrile. The vinylpyridine polymers used in the examples herein had an intrinsic viscosity in the range of from 0.2 to 2.0 measured in pyridine at 30° C.

While vinylpyridine polymers may generally be blended easily into the polymeric matrix, some problems may be encountered when the plastic article made from said blend is placed in a chromic-sulfuric acid etching bath during the pretreatment process, because some of the vinylpyridine polymer may be leached out of the plastic. This leaching problem is overcome by using a less severe etching treatment (i.e., using a mildly acidic etching bath and/or using poly(vinylpyridine) having a higher intrinsic viscosity, and/or by using interpolymers of vinylpyridine and acrylonitrile and styrene.

It is highly desirable to obtain a homogeneous blending of the matrix and electroless metal depositing aid polymers. The blends used in the various examples set forth herein were banded on a rubber mill and mixed or were fused in an internal mixer. The samples used for plating in the examples can be made by using the blended material from the rubber mill or mixer subsequently and compression molding the plastic sample or by using injection molding or extruding methods.

Thus by blending between about 0.1% and 45% (by weight) of such electroless metal depositing aids into the matrix polymers described herein, improvements in the electroless metal depositing rate and uniformity of coverage are obtained when the samples are placed after pretreatment in solutions of either electroless nickel or electroless copper, with the greatest improvements occurring using electroless nickel solutions.

The platability of the matrix which has been modified with the electroless metal depositing aid is observed even when the specific gravity of the etchant used in the pretreatment steps is below the levels recommended in the standard etching procedures, and/or when electrolessly plating in solutions in which the metal ion in solution to be plated onto said plastic is below the levels recommended in the standard plating solutions used in industry.

It has further been determined that using the modified matrix as defined above, the bond strength between metal and plastic substrate is increased. This bond strength is determined by measuring the force required to separate a metal strip such as electrolytically deposited copper on the electrolessly deposited nickel from the surface of the plastic in accordance with the Jacquet Test as disclosed in Bickerman, Science of Adhesion Joint, Academic Press, 1961, p. 183.

The samples used in the examples listed herein were prepared using any one of the above described polymerization methods and in some cases were tested to determine plating adhesion improvement over the existing plastics. The following examples are listed by way of illustration.

EXAMPLE 1

This example is the procedure for pretreating a thermoplastic material such as ABS, polypropylene, poly(vinylchloride) etc. prior to electroplating using one of the standard commercial processes.

An injection molded sample (2¼" x 3⅛") of ABS plastic consisting of a graft resin blend of 65 parts of (74/26) styrene-acrylonitrile copolymer prepared using the method disclosed by Smith in Manufacture of Plastics, N.Y., Reinhold, 1964, Vol. 1, p. 452, and having an intrinsic viscosity in dimethyl formamide of 0.55 with ABS (16/50/34) graft polymer which was prepared using the method described in U.S. Pat. 3,238,275, was immersed in a solution of an etchant (Macuplex ABS etchant) which is a mixture of chromic and sulfuric acid wherein the amount of $Cr^{+6}$ ion is approximately 1.40 weight percent and is supplied by chromic oxide or chromic salts such as potassium dichromate at 58.9°±.3 Be' at 135° F., for 2 to 3 minutes. The sample was then rinsed and immersed for two minutes at room temperature in a 5% activating solution (in water) having a pH between 1.7 and 2.2 of $PdCl_2$ in HCl and water with suitable buffering, stabilizing and complexing agents. (The solution used is known as and sold under the name of Macuplex Activator B). The sample was again rinsed and subsequently immersed for 20 seconds at 75° F. in a 2% accelerator solution with water. This accelerator solution, which has a pH between 6.5 and 8.5 contains sodium acid sulfate as a reducing agent and is sold under the name Macuplex accelerator. This solution reduces the palladium chloride on the surface of the plastic to metallic palladium. The sample was again rinsed.

The sample was then immersed in a commercially available electroless metal solution known as Macuplex chemical nickel containing one or more salts of nickel plus buffering, stabilizing and reducing agents. No nickel adhered to the surface of the plastic after immersion into the chemical nickel solution.

An attempt was made to electroplate the pretreated sample using a conventional electrolytic plating method and little or no coverage resulted therefrom.

The etchant, activator and metal solutions used in the following examples were the same as those used in Example 1. In some examples the temperature was varied.

EXAMPLE 2

Samples of ABS plastics having the compositions defined in Tables 1 and 2 and prepared using the methods disclosed in Example 1, or as indicated, were treated using the method of Example 1 with the exception that the activator solution was a 6% solution, the accelerator solution was a 2.5% solution and the electroless nickel solution was used at 150° F. at a pH of 5.

Tables 1 and 2 illustrate various blends of matrix polymers some of which contain an electroless metal depositing aid and some which do not contain an electroless metal depositing aid. In some cases the tables compare the coverage (percent of the surface of the plastic article which is covered by the metal after electroless plating) and bond strength (according to the Jacquet Test described above) of the various experimental and control blends and also disclose the conditions under which the tests were performed. The values in parenthesis after the written name description of the polymer in a number of the tables included in examples disclosed herein indicate the respective percentages of each monomeric unit of which the polymer is composed.

TABLE 1

| Material | Parts: Experiment | Parts: Control |
|---|---|---|
| Styrene-acrylonitrile-vinylpyridine terpolymer (64.5/31.5/4) I.V. (intrinsic viscosity) in dimethyl formamide (DMF)=.57 at 30° C. (prepared as in copending application Serial No. 754,949, filed August 23, 1968) | 10 | ---------- |
| Styrene-acrylonitrile copolymer (74/26) I.V. in DMF .55 at 30° C | 55 | 65 |
| ABS-graft polymer (16/50/34) | 35 | 35 |
| Pigments | 4.033 | 4.033 |
| Lubricant | 3.0 | 3.0 |
| Time in solution: | | |
| Etchant (58.5 Bé. at 135° F.), sec | 30 | 30 |
| Activator (120° F.), sec | 30 | 30 |
| Accelerator (room temperature), sec | 30 | 30 |
| Electroless Nickel Coverage, percent | 100 | (1) |
| Response in bond strength as tested by the Jacquet Test | (2) | 0 |

1 No coverage.
2 6.85 lbs./in. at 1.5 mil. thickness of electrolytic copper plus electroless nickel.

TABLE 2

| Material | Parts: Experiment | Parts: Control |
|---|---|---|
| Styrene-acrylonitrile copolymer (74/26) I.V. in DMF=.55 at 30° C | 62 | 62 |
| ABS-graft polymer (16/50/34) (U.S. Pat. 3,238,275) | | 38 |
| Vinylpyridine-ABS graft interpolymer (8/15/50/28) | 38 | ---------- |
| Pigments | 4.033 | 4.033 |
| Lubricant | 3.0 | 3.0 |
| Time in solution: | | |
| Etchant (58.5 Bé. at 135° F.,) sec | 45 | 45 |
| Activator (room temperature), sec | 30 | 30 |
| Accelerator (room temperature), sec | 30 | 30 |
| Electroless nickel coverage, percent | 100 | (1) |
| Response in bond strength as tested by the Jacquet Test | (2) | 0 |

1 No coverage.
2 5 lbs./in. at 1.1 mil. thickness.

EXAMPLE 3

This example illustrates the use of a homopolymer of vinylpyridine blended with ABS to form a plastic possessing increased electroless metal platability. The procedure and reagents used to pretreat such plastic were the same as those used in Example 1 with the conditions used in the procedure listed in Table 3.

TABLE 3

| Material | Parts: Experiment | Parts: Control |
|---|---|---|
| A (blend of 65) styrene-acrylonitrile copolymer (74/26) plus 35 parts ABS graft polymer (16/50/34) | 100 | 100 |
| Poly(2-methyl-5-vinylpyridine) I.V. in pyridine=.55 at 30° C | 5 | 0 |
| Pigments | 4.033 | 4.033 |
| Lubricant | 3.0 | 3.0 |
| Time in solution: | | |
| Etchant (55° Bé. at 140° F.), min | 3 | 3 |
| Activator (room temperature), min | 3 | 3 |
| Accelerator (room temperature), min | 1 | 1 |
| Electroless nickel treatment (150° F.) min | 5 | 5 |
| Electroless nickel coverage, percent | 100 | None |

EXAMPLE 4

This example illustrates the use of a 50/50 copolymer of styrene and 2-vinylpyridine as an additive to the ABS graft resin blend described in Example 1. The conditions, reagents and procedure used were identical to those set forth in Example 3. The data is presented in Table 4.

TABLE 4

| Material | Parts: Experiment | Parts: Control |
|---|---|---|
| A (blend of 65) styrene-acrylonitrile copolymer (74/26) plus 35 parts ABS graft resin polymer (16/50/34) | 100 | 100 |
| Poly-Co (styrene-2-vinylpyridine) (50/50) I.V. in pyridine=.85 at 30° C | 5 | ---------- |
| Electroless nickel coverage, percent | 100 | None |

EXAMPLE 5

This example illustrates the improved coverage on high impact styrene by adding an electroless metal depositing aid (a vinylpyridine copolymer) thereto. The styrene used is sold under the trademark "Styron" and has a specific gravity of about 1.05; tensile strength between about 5500 and 7000 lb./in.$^2$; distortion temperature of about 172° to about 176° F. and a softening point of around 220°–240° F. The conditions, reagents and procedure used were identical to those used in Example 3. The data is presented in Table 5.

TABLE 5

| Material | Parts: Experiment | Parts: Control |
|---|---|---|
| General purpose polystyrene (Styron 66) | 100 | 100 |
| The copolymer of 2-methyl-5-vinylpyridine and 2-vinylpyridine (50/50) | 5.0 | ---------- |
| Pigment | 4.0 | 4.0 |
| Lubricant | 3.0 | 3.0 |
| Electroless nickel coverage, percent | 100 | None |

EXAMPLE 6

This example illustrates the improvement in platability of a poly(vinylchloride) known as Marvinol 7120 and sold by Uniroyal, Inc., by the addition of an electroless metal depositing aid, i.e., poly(2-methyl-2-vinylpyridine) thereto. The conditions, reagents and treatment used were similar to Example 1 with the exceptions listed in Table 6.

TABLE 6

| Material | Parts | |
|---|---|---|
| | Experiment | Control |
| Impact grade poly(vinylchloride) Marvinol 7120, specific viscosity=.38 to .25 in nitrobenzene at 25° C | 100 | 100 |
| Poly (2 methyl-5-vinylpyridine) V.I. in pyridine=.55 at 30° C | 6 | 0 |
| Pigments | 4.033 | 4.033 |
| Lubricant | 3.0 | 3.0 |
| Time in solution: | | |
| Etchant (43° Bé. at 155° F.), min | 3 | 3 |
| Activator (90° F.), min | 3 | 3 |
| Accelerator (room temperature), min | 1 | 1 |
| Electroless nickel, min | 5 | 5 |
| Electroless nickel coverage, percent | 100 | None |
| Response in bond strength, lbs./in | 5.6 | |

EXAMPLE 7

Using the conditions, reagents and procedure described (in Example 6, two acetal resins (i.e. a thermoplastic resin produced by the addition polymerization of aldehydes through the carbonyl function yielding unbranched polyoxymethylene chains of great length) samples, one of which contained poly(2-methyl-5-vinylpyridine) and the other which did not contain same, were immersed in 10% acetone in water for one minute, and then treated as described in Example 6. Table 7 indicates the polymer compositions and results of electrolessly plating the pretreated plastic materials.

TABLE 7

| Material | Parts | |
|---|---|---|
| | Experiment | Control |
| An acetal resin sold under the trademark Delrin 100, a homopolymer of [—(—OCH$_2$)n] | 100 | 100 |
| Poly(2-methyl-5-vinylpyridine) I.V. in pyridine=.55 at 30° C | 3 | 0 |
| Electroless nickel coverage, percent | 100 | 0 |

EXAMPLE 8

This example illustrates the incorporation of an electroless metal depositing aid in a cellulose acetate butyrate resin sold under the trademark "Tenite." The conditions, reagents and procedure used to treat the plastic was similar to that used in Example 1 with the exceptions listed in Table 8.

TABLE 8

| Material | Parts | |
|---|---|---|
| | Experiment | Control |
| Cellulose acetate butyrate resin known as "Tenite 236" | 100 | 100 |
| Poly(2-methyl-5-vinylpyridine) I.V. in pyridine=.55 at 30° C | 3 | 0 |
| Time in solution: | | |
| Etchant (59° Bé. at 135° F.) sec | 5 | 5 |
| Activating (100° F.), min | 3 | 3 |
| Accelerator (room temperature), sec | 30 | 30 |
| Electroless nickel (150° F.), min | 5 | 5 |
| Electroless nickel coverage, percent | 100 | (1) |

1 Negligible.

EXAMPLE 9

This example illustrates the use of a polysulfone matrix containing a blend of an ABS graft resin blend having the composition described in Example 1 and a vinylpyridine polymer having the composition described in Example 2.

The conditions, reagents and procedure used for treating the blends were the same as described in Example 1 with the exception of the I.V. of the styrene-acrylonitrile copolymer. Table 9 lists the data:

TABLE 9

| Material | Parts | |
|---|---|---|
| | Experiment | Control |
| Polysulfone 1 | 50 | 50 |
| ABS-graft polymer (16/50/34) | 37.5 | 37.5 |
| Styrene-acrylonitrile (74/26) I.V.=1.2 in DMF at 30° C | 0 | 12.5 |
| Acrylonitrile-(2-vinylpyridine)-styrene (31/5/64.5) I.V.=0.57 in DMF at 30° C | 12.5 | 0 |
| Electroless nickel coverage, percent | 100 | 0 |
| Bond strength, lbs./in | 3.0 | ---- |

1 Polysulfone used P-1700 sold by Tennessee Eastman Co. and has the repeating unit:

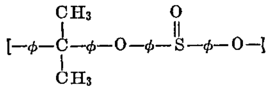

EXAMPLE 10

This example illustrates the incorporation of a non-aromatic ring electroless metal depositing aid additive into an ABS matrix. The additive is the reaction product of styrene-maleic anhydride (SMA) copolymer with dimethylaminopropylamine (DMAPA) as described in U.S. Pat. 3,048,487 or 3,184,309 and had an intrinsic viscosity of 0.8 on xylene at 30° C. The ABS matrix used was the ABS graft resin blend described in Example 1.

TABLE 10

| Material | Parts | |
|---|---|---|
| | Experiment | Control |
| ABS graft-resin blend | 100 | 100 |
| (SMA) copolymer treated with (DMAPA) | 4.3 | 0 |
| Time in solution: | | |
| Etchant same as Example 1 at 130° F., min | 3 | 3 |
| Activator (room temperature), min | 3 | 3 |
| Accelerator (room temperature), min | 3 | 3 |
| Electroless nickel treatment (150° F.), min | 5 | 5 |
| Electroless nickel coverage, percent | 100 | None |

EXAMPLE 11

This example illustrates the incorporation of a vinylpyridine containing interpolymer, as described in Example 1, into a matrix which is a blend of a styrene-acrylonitrile (74/26) copolymer prepared in Example 1 and an ABS unstripped graft copolymer prepared as in Japanese patent publication SHO42–1577. The reagents and procedure used to pretreat and electrolessly plate the materials were similar to those used in Example 1. The data and conditions are listed in table.

TABLE 11

| Material | Parts | |
|---|---|---|
| | Experiment | Control |
| Styrene-acrylonitrilevinylpyridine (64.5/31.5/4) I.V. in DMF=.57 | 30 | --------- |
| Styrene-acrylonitrile (74/26) I.V. in DMF=.55 | 30 | 60 |
| ABS unstripped graft [80% butadiene content (75% conversion) 20% styreneacrylonitrile content having a (70/30) ratio] | 40 | 40 |
| Time in solution: | | |
| Etchant (59° Bé. at 110° F.), min | 1 | 1 |
| Activator room temperature, sec | 30 | 30 |
| Accelerator room temperature, sec | 15 | 15 |
| Electroless nickel (150° F.), min | 5 | 5 |
| Electroless nickel coverage, percent | 100 | 50 |
| Response in bond test, lbs./in | 10 | 0 |

Having thus described our invention, what we claim and desire to protest by Letters Patent is:

1. A shaped article comprising a layer of a metal selected from the group consisting of nickel or copper which has been electrolessly deposited on a plastic substrate, said plastic substrate comprising a blend of a high polymer selected from the group consisting of:

(a) acrylonitrile-butadiene-styrene-interpolymers,
(b) styrene-acrylonitrile copolymers,
(c) acrylonitrile-butadiene copolymers,
(d) blends of (a), (b) and (c),
(e) vinyl polymers,
(f) polyesters,
(g) polycarbonates, (h) polysulfones,
(i) polyolefins or
(j) polyamides,
(k) cellulose acetate butyrate, and between 0.1% and 45% (based on the total weight of the blend) of a basic nitrogen containing polymer selected from the group consisting of:

(a) poly(vinylpyridine);
(b) interpolymers of different vinylpyridine monomers with each other;
(c) interpolymers of acrylonitrile, butadiene, styrene and vinylpyridine;
(d) the reaction product of styrene-maleic anhydride copolymer with dimethyl-amino-propylamine.

2. The shaped article defined in claim 1 in which said plastic substrate comprises a blend wherein the high polymer is acrylonitrile-butadiene-styrene resin, and basic nitrogen-containing polymer is an interpolymer of vinylpyridine styrene-acrylonitrile.

3. The shaped article defined in claim 1 in which said plastic substrate comprises a blend wherein the high polymer is polypropylene and the basic nitrogen containing polymer is poly(vinylpyridine).

4. The shaped article defined in claim 1 in which said plastic substrate comprises a blend wherein the high polymer is polysulfone and the basic nitrogen-containing polymer is an interpolymer of vinylpyridine-styrene-acrylonitrile.

5. The shaped article defined in claim 1 in which said plastic substrate comprises a blend wherein the high polymer is poly(vinylchloride) and the basic nitrogen containing polymer is poly(vinylpyridine).

6. The shaped article defined in claim 1 in which said plastic substrate comprises a blend wherein the high polymer is polystyrene and the basic nitrogen containing polymer is polyvinylpyridine.

7. The shaped article defined in claim 1 in which said plastic substrate comprises a blend wherein the high polymer is cellulose acetate butyrate and the basic nitrogen containing polymer is polyvinylpyridine.

References Cited

UNITED STATES PATENTS

| | | | |
|---|---|---|---|
| 3,303,148 | 2/1967 | Joyner et al. | 260—895 |
| 2,613,194 | 10/1952 | Craig | 260—895 |
| 2,637,717 | 5/1953 | Basdekis | 260—895 |
| 2,668,134 | 2/1954 | Horton | 204—30 UX |
| 3,058,845 | 10/1962 | Hendricks | 117—160 X |
| 3,115,478 | 12/1963 | Giustinigni et al. | 260—895 |
| 3,315,014 | 4/1967 | Coover et al. | 260—883 |

FOREIGN PATENTS

| | | |
|---|---|---|
| 763,293 | 12/1956 | Great Britain. |

ALFRED L. LEAVITT, Primary Examiner

J. A. BELL, Assistant Examiner

U.S. Cl. X.R.

117—138.8 UA, 160 R; 204—30; 260—883, 895